United States Patent [19]

Murase et al.

[11] Patent Number: 4,675,783

[45] Date of Patent: Jun. 23, 1987

[54] HEAT PIPE HEAT SINK FOR SEMICONDUCTOR DEVICES

[75] Inventors: Takashi Murase, Yokohama; Tatsuya Koizumi, Tokyo, both of Japan

[73] Assignees: The Furukawa Electric Co., Ltd., Tokyo; Fuji Electric Co., Ltd., Kawasaki, both of Japan

[21] Appl. No.: 646,074

[22] Filed: Aug. 31, 1984

[30] Foreign Application Priority Data

Sep. 9, 1983 [JP]  Japan .................. 58-166253

[51] Int. Cl.$^4$ ............................................. H05K 7/20
[52] U.S. Cl. .................. 361/385; 165/104.14; 174/15 HP; 357/82
[58] Field of Search ......... 165/104.14, 104.33; 174/15 HP; 357/82; 361/385

[56] References Cited

U.S. PATENT DOCUMENTS 3,656,035  4/1972  Corman et al. ............. 165/104.33
3,951,470  4/1976  Devendorf .................. 361/380

FOREIGN PATENT DOCUMENTS 0000989   1/1981  Japan .................. 165/104.14
0112947   8/1981  Japan .
0112482   8/1982  Japan .

Primary Examiner—Roy N. Envall, Jr.
Assistant Examiner—Greg Thompson
Attorney, Agent, or Firm—Oblon, Fisher, Spivak, McClelland & Maier

[57] ABSTRACT

A heat pipe heat sink for air cooling of semiconductor devices characterized by arranging heat pipes in a zig-zag form toward the direction of air flow around the fin section in the heat sinks. A block for mounting the semiconductor device is fitted to the heat-in sections of the plural heat pipes arranged in parallel, and a large number of radiating fins crossing over the heat pipes are fitted to the heat-out sections of the heat pipes protruding from the block.

6 Claims, 12 Drawing Figures

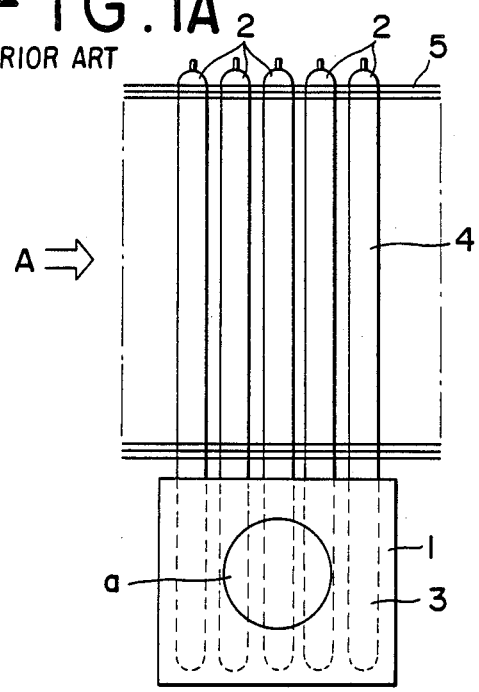
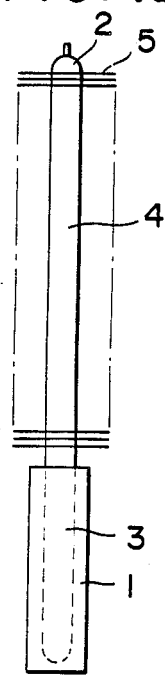
FIG. IA PRIOR ART
FIG. IB PRIOR ART
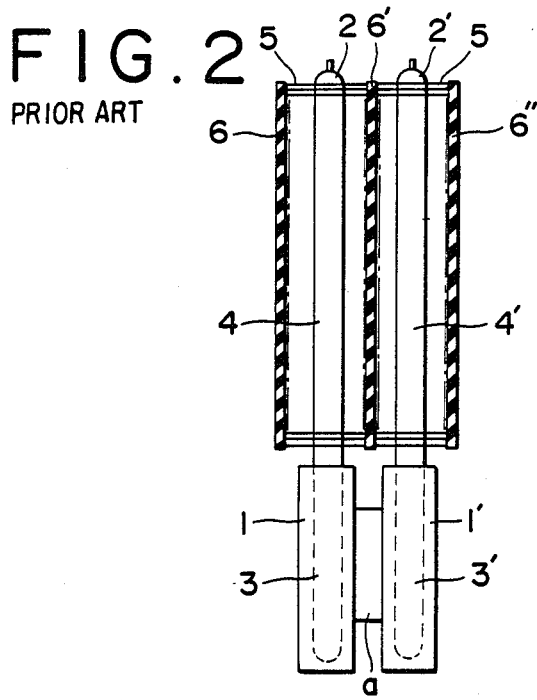
FIG. 2 PRIOR ART

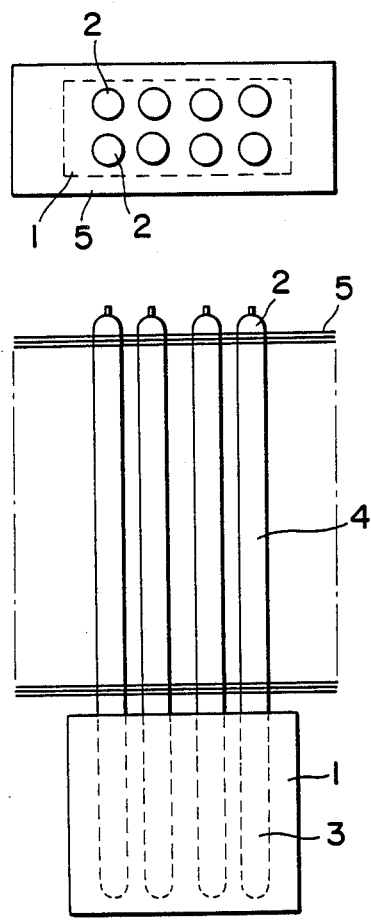
FIG. 3A PRIOR ART
FIG. 3B PRIOR ART
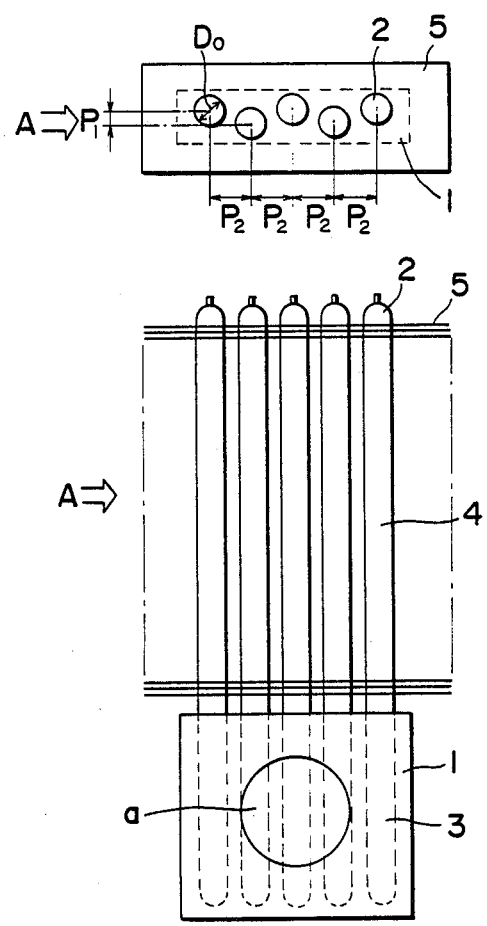
FIG. 4A
FIG. 4B

FIG.5A
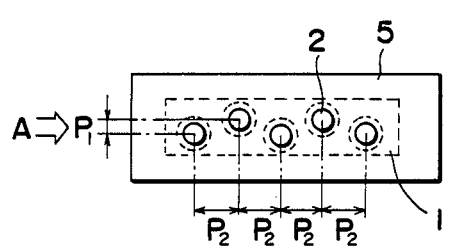
FIG.6A
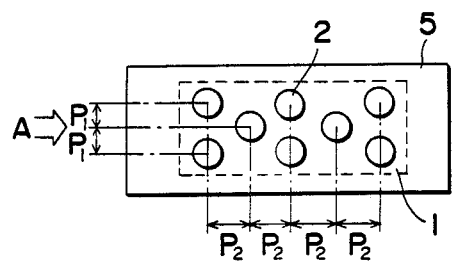
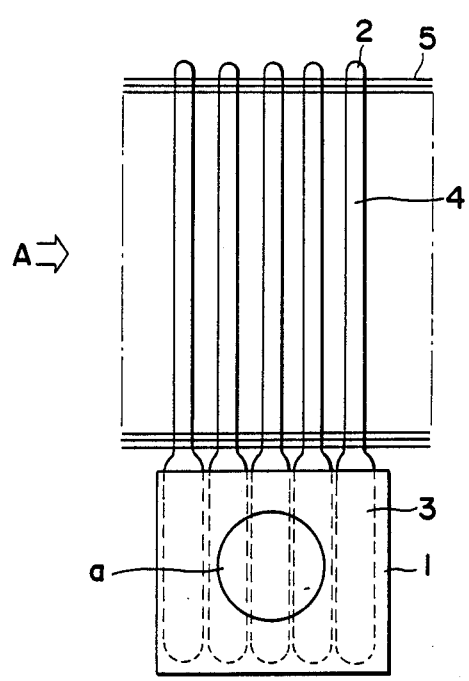
FIG.5B
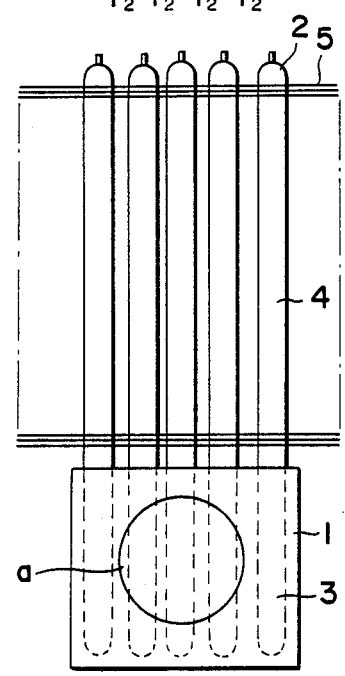
FIG.6B

4,675,783

HEAT PIPE HEAT SINK FOR SEMICONDUCTOR DEVICES

FIELD OF THE INVENTION

The present invention relates to a heat pipe heat sink for semiconductor devices, characterized particularly by improved radiation characteristics.

BACKGROUND OF THE INVENTION

Recently, for the cooling of semiconductor devices (for example, thyristors for power conversion, diodes, etc.), heat sinks utilizing the excellent heat transfer performance and excellent heat-in and heat-out capabilities of heat pipes have come to be used. These heat sinks have better radiation characteristic than conventional air cooled heat sink made of extrusion and water cooled heat sinks, etc. and are reduced in size and weight. As shown in FIGS. 1(A) and (B), such heat sinks have a construction wherein the heat-in sections (3) of the plural heat pipes (2) arranged parallel in a row are inserted into a block (1) on which a semiconductor device (a) is mounted. A large number of radiating fins (5) crossing over the heat pipes (2) at right angles thereto are fitted to the heat-out sections (4) of the heat pipes (2) protruding from the block (1) in a row.

For the block (1) and the fins (5), copper or aluminum is used, and for the heat pipes (2), copper-water type or aluminum-freon type is used. Ordinarily, as shown in FIG. 2, two heat sinks are combined in parallel. Electrical insulating plates (6), (6'), and (6'') are arranged between the fins 5 of each heat sink. The semiconductor device (a) is put between block (1) and a parallel block (1'). The heaat-in sections (3) and (3') of the heat pipes (2) and (2') are inserted in the blocks (1) and (1'), respectively. The heat generated from the semiconductor device (a) is transferred to the heat pipes (2) and (2') through the blocks (1) and (1'), and allowed to radiate from the fins (5) and (5') fitted to the heat-out sections (4) and (4') of the heat pipes (2) and (2'), respectively. The coaling rate is increased by sending air in the direction A indicated by an arrow in FIG. 1.

With regard to the insertion of the heat pipes (2) into the block (1), in order to keep the thermal resistance from the semiconductor device (a) to the minimum, the heat pipes (2) are fitted so as to be brought close to a minimum distance capable of maintaining a fixed degree of mechanical strength against the plane of the block (1) where the semiconductor device (a) is mounted. The heat pipes (2) are inserted in a row in the block (1) at appropriate pitch intervals.

Moreover for the radiation of large-capacity semiconductor devices, the heat sinks are used as shown in FIGS. 3(A) and (B). That is, the plural heat pipes (2) are arranged in parallel in two rows, the heat-in sections (3) thereof being inserted into the block (1), and a large number of fins (5) crossing over the heat pipes (2) at right angles thereto are fitted to the heat-out sections (4) of the heat pipes (2) protruding from the block (1) in two rows.

Although all of these heat pipe heat sinks show better radiation characteristics compared with the conventional air cooled heat sink made of extrusion and water cooled heat sink, etc., further improvement has been desired.

SUMMARY OF THE INVENTION

As a result of the investigations from various angles on the arrangement and the shape of heat pipes in the heat sink in view of the facts described above, the inventors have realized, that, since the heat pipes are arranged regularly and uniformly in a row of two rows toward the direction of air flow, a turbulence is not caused in the air flow in the direction A. Instead, a laminar flow is caused, which makes the thermal resistance at the fin section increase, resulting in a decrease in the radiation characteristic. After further investigations, the inventors have developed a heat pipe heat sink for semiconductor devices in which they have lowered the thermal resistance of the whole heat sink through an improvement in the forced convection efficiency at the fin section and enhanced the performance per enveloping volume (occupying volume of a heat sink including the space sections between fins). Namely, in the heat pipe heat sink of the invention, the heat pipes are arranged in a zigzag form in the direction of air flow around the fin section in the heat sinks. A block for mounting the semiconductor device is inserted with the heat-in sections of the plural heat pipes located in parallel and a large number of radiating fins crossing over the heat pipes are fitted to the heat-out sections of the heat pipes protruding from said block.

BRIEF DESCRIPTION OF THE DRAWINGS

FIGS. 1(A) and 1(B) show one example of the conventional heat pipe heat sinks, FIG. 1(A) being a front view and FIG. 1(B) being a side view.

FIG. 2 is a side view illustrating use of the heat sink shown in FIGS. 1(A) and 1(B).

FIGS. 3(A) and 3(B) show another example of the conventional heat pipe heat sinks, FIG. 3(A) being a top view and FIG. 3(B) being a front view.

FIGS. 4(A) and 4(B) show a first embodiment of the sink of the invention, FIG. 4(A) being a top view and FIG. 4(B) being a front view.

FIGS. 5(A) and 5(B) show a second embodiment of the heat sink of the invention, FIG. 5(A) being a top view and FIG. 5(B) being a front view.

FIG. 6(A) and 6(B) show a third embodiment of the heat sink of the invention, FIG. 6(A) being a top view and FIG. 6(B) being a front view.

Figure 7:
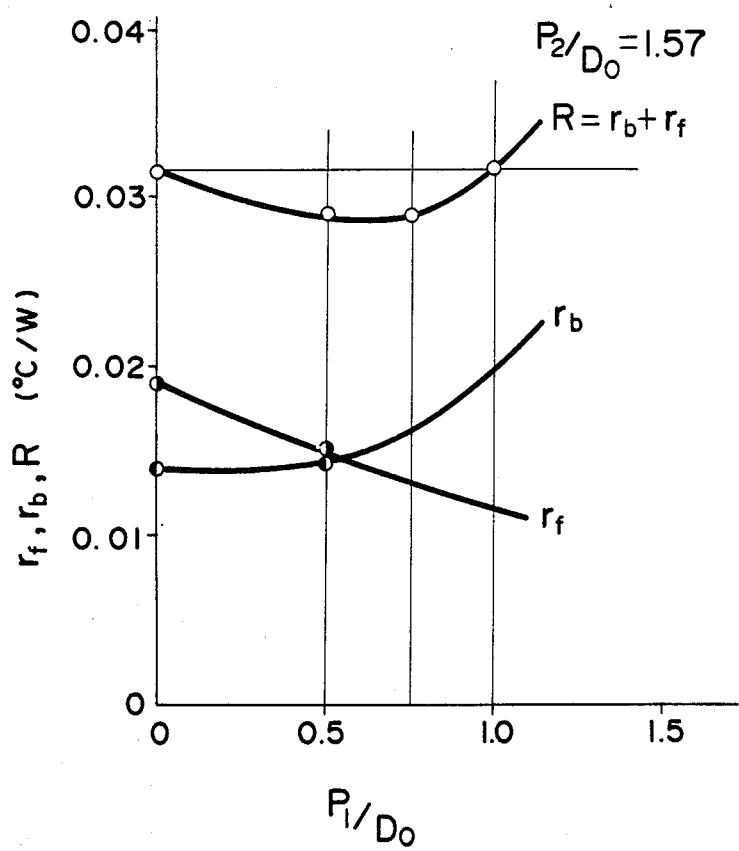

FIG, 7 is a diagram showing the effect of the ratio $P_1/D_0$ on the thermal resistance of respective sections in the case of the heat sink down in FIGS. 4(A) and 4(B), $P_1$ being the pitch of the heat pipes in the direction making a right angle with the direction of air flow and $D_0$ being the diameter of the heat pipe.

FIGS. 4(A) and 4(B) show one example of a heat sink in accordance with the invention. In these figures, (a) indicates a semiconductor device, (1) indicates a block for mounting the semiconductor device, (2) indicates a heat pipe, and (5) indicates a radiating fin, respectively. The plural heat pipes (2) are arranged in staggered rows in other words, parallel in a zigzag form in the direction A of air flow. The heat-in sections (3) thereof are inserted into the block (1), and a large number of radiating fins (5) crossing over the heat pipes (2) at right angles are fitted to the heat-out sections (4) of the heat pipes (2) protruding from the block (1) in a zigzag form.

The heat sink of the present invention has a construction as described above through the arrangement of the heat-out sections of the heat pipes in a zigzag form in the direction of air flow (the direction A indicated by an arrow in the figure) around the fin section, turbulence is caused in the air flow around the heat-out sections without deterioration of the thermal resistance at the block section. Moreover, the forced convection effect is improved remarkably, resulting in a lowering of the thermal resistance of the whole heat sink and an improvement in the performance per enveloping volume.

Moreover, if further improvement is desired in the performance per enveloping volume of the heat sink of the present invention, the diameter of the pipe at the heat-in sections (3) of the heat pipes (2) to be inserted into the block (1) may be made thicker than that at the heat-out sections (4) as shown in FIGS. 5(A) and 5(B). Also, when conducting the radiation of large capacity semiconductor devices by using the heat sink of the present invention, the plural heat pipes (2) may be arranged parallel in a zigzag form and in multiple rows. The heat-in sections (3) in this configuration are inserted into the block (1), and a large number of fins (5) crossing over the heat pipes (2) at right angles may be fitted to the heat-out sections (4) of the heat pipes (2) protruding from said block (1) parallel in a zigzag form and in multiple rows as shown in FIGS. 6(A) and 6(B).

EXAMPLES

In the following, explanations are given about examples of the invention in order to clarify the effect of the invention.

EXAMPLE 1

This example is illustrated in FIGS. 4(A) and 4(B). Five copper-water type heat pipes 2 having a diameter of 15.88 mm and a length of 370 mm were arranged in a parallel zigzag form with their heat-in sections 3 inserted into an aluminum block 1. A semiconductor device a having a height of 120 mm, a width of 130 mm, and a thickness of 30 mm was mounted on the block 1. 115 sheets of radiating fins 5 made of aluminum and having a length of 190 mm, a width of 40 mm, and a thickness of 0.5 mm were fitted at a pitch of 2 mm to the heat-out sections 4 of the heat pipes 2 protruding from the block 1 in a zigzag form. Moreover, with regard to the arrangement of the heat pipes 2, the pitch $P_1$ in the direction at a right angle to the direction A of air flow was set at 8 mm. Accordingly, ratio of $P_1$ to the diameter $D_0$ of the heat pipes was $P_1/D_0=0.50$. The pitch $P_2$ in the direction of air flow was set at 25 mm. Accordingly, the ratio of $P_2$ to the diameter $D_0$ of the heat pipes was $P_2/D_0=1.57$.

Two such heat sinks were combined in parallel as a pair, and a thyristor having a power loss of 1000 W was put between and two blocks 1. Then, ambient air was blown across the heat out sections 4 of the radiating fins 5 in the direction of the arrow A at a velocity of 3 m/sec, and ambient air temperature (Ta[°C.]), temperature of the thyristor-mounted surface of the block (Tb[°C.]), and temperature of the heat pipe (Thp[°C]) were measured. The thermal resistances were calculated by the following formulas. The results are shown in Table 1, compared with those obtained from the conventional heat sink having the construction shown in FIGS. 1(A) and FIG. 1(B), having the same enveloping volume, and using the same blocks and the same heat pipes. Thermal resistance at the block section:

$$rb=(Tb-Thp)/Q$$

Thermal resistance at the fin section:

$$rf=(Thp-Ta)/Q$$

Total thermal resistance:

$$R = rb + rf$$
$$= (Tb - Ta)/Q$$

wherein (Q indicates the heat power loss of the thyristor. (W))

TABLE 1

|  | rb [°C./W] | rf [°C./W] | R [°C./W] |
|---|---|---|---|
| Conventional heat sink | 0.0135 | 0.0180 | 0.0315 |
| Heat sink in the invention | 0.0137 | 0.0150 | 0.0287 |

As is evident from Table 1, in the case of the heat sink according to the invention, the increase in the thermal resistance at the block section (rb) due to the zigzag arrangement of the heat pipes is slight (only 1% increase), while the thermal resistance at the fin section (rf) is 17% lowered 0.0150° C./W as against 0.0180° C./W in the case of the conventional heat sink). This shows that the turbulent effect of the air flow is remarkable. In fact, the total thermal resistance (R) is improved as much as 9%.

Next, the relationships between the ratio of the pitch $P_1$ in the direction at a right angle to the direction of air flow to the diameter $D_0$ of the heat pipe (that is, $P_1/D_0$) and the thermal resistances at various sections were investigated. One example (wherein the ratio of the pitch $P_2$ in the direction of air flow to the diameter $D_0$ of the heat pipe $P_2/D_0=1.57$) is shown in FIG. 7. As can be seen from that figure, there exist respective correlations shown in the figure between thermal resistance at the block section (rb), thermal resistance at the fin section (rf), and total thermal resistance (R) and $P_1/D_0$. It will be seen that the total thermal resistance (R) becomes minimum within a range of $P_1/D_0$ of 0.5 to 0.75 and that the total thermal resistance (R) approaches the performance of the conventional heat sink as $P_1/D_0$ approaches 1. Therefore, it is preferable to set $P_1/D_0$ at 0.5 to 0.75 in order to obtain the most efficient total thermal resistance. Besides, it is also preferable to set $P_2/D_0$ at 1.5 to 2.0, though there are no particular limitations.

EXAMPLE 2

This example is illustrated in FIGS. 5(A) and 5(B). Five copper-water type heat pipes 2 with a total length of 370 mm, each having a two-step diameter, the heat-in section 3 (inserting section into the block 1) having a length of 115 mm and a diameter of 19.05 mm and the heat-out section 4 (fitting section of the fins 5) having a diameter of 12.7 mm, were located in a parallel zigzag form with their heat-in sections 3 inserted into an aluminum block 1. A semiconductor device a having a height of 120 mm, a width of 130 mm, and a thickness of 30 mm was mounted on the block 1. 115 sheets of fins 5 made of aluminum and having a length of 190 mm, a width of 40 mm, and a thickness of 0.5 mm were fitted at a pitch of 2 mm to the heat-out sections 4 of the heat pipes 2 protruding from the block 1 in a zigzag form. Moreover, the pitch $P_1$ in the direction at a right angle to the direction of air flow was set at 8 mm (ratio to the diameter $D_0$ of the heat pipe at the fin section $P_1/D_0=0.63$), and the pitch $P_2$ in the direction of air flow was set at 25 mm (ratio to the diameter $D_0$ of the heat pipe at the fin section $P_2/D_0 = 1.97$), respectively.

Two such heat sinks were combined in parallel as a pair, and a thyristor, having a power loss of 1000 W was put between the two blocks 1. Then, similar measurements as in Example 1 were carried out with an air flow velocity of 3 m/sec to calculate the thermal resistances. These results are shown in Table 2 compared with those obtained from the conventional heat sink having the construction shown in FIGS. 1(A) and 1(B) having the same enveloping volume, using straight-pipe type heat pipes with a diameter of 15.88 mm, and the same blocks and the same fins.

TABLE 2

|  | rb [°C./W] | rf [°C./W] | R [°C./W] |
|---|---|---|---|
| Conventional heat sink | 0.0135 | 0.0180 | 0.0315 |
| Heat sink in the invention | 0.0125 | 0.0140 | 0.0265 |

As is evident from Table 2, in the case of the heat sink according to the present invention, through the enlargement of the diameter of the heat-in section of heat pipe inserting into the block, the deterioration of the thermal resistance at the block section (rb) due to the zigzag arrangement of the heat pipes is not observed. Moreover, through the reduction of the diameter of the heat-out section of heat pipe, the thermal resistance at the fin section (rf) is improved significantly resulting from the turbulent effect of the air flow as well as an increase in the effective heat transfer area, and the total thermal resistance (R) is lowered to 0.0265° C./W—showing an improvement of as much as 16%.

As described, in the case of the heat sinks of the present invention in Examples 1 and 2, having heat pipes arranged in a parallel zigzag form and in one stage, it is preferable to set $P_1/D_0$ at 0.5 to 0.75 and $P_2/D_0$ at 1.5 to 2.0 in order to obtain the particularly efficient total thermal resistance.

EXAMPLE 3

This example is illustrated in FIGS. 6(A) and 6(B). Eight copper-water type heat pipes 2 having a diameter of 12.7 mm and a length of 380 mm were arranged in a parallel zigzag form and in two stages with their heat-in sections 3 inserted into a block 1. A semiconductor device a having a height of 120 mm, a width of 120 mm, and a thickness of 60 mm was mounted on the block 1. and 120 sheets of radiating fins 5 made of copper and having a length of 185 mm, a width of 75 mm, and a thickness of 0.4 mm were fitted at a pitch of 1.9 mm, to the heat-out sections 4 of the heat pipes 2 protruding from the block 1, in a zigzag form, and in two stages. Moreover, with regard to the arrangement of the heat pipes 2, the pitch $P_1$ in the direction at a right angle to the direction of air flow was set at 12.5 mm (ratio to the diameter $D_0$ of the heat pipe $P_1/D_0 = 0.98$), and the pitch $P_2$ in the direction of air flow was set at 22 mm (ratio to the diameter $D_0$ of the heat pipe $P_2/D_0 = 1.72$), respectively.

Two such heat sinks were combined in parallel as a pair, and a thyristor having a power loss of 1500 W was put between the two blocks 1. Then, similar measurements as in Example 1 were carried out with an air flow velocity of 3 m/sec to calculate the thermal resistances. These results are shown in Table 3, compared with those obtained from the conventional heat sink shown in FIGS. 3(A) and 3(B) having the same enveloping volume and using the same heat pipes, the same blocks, and the same fins.

TABLE 3

|  | rb [°C./W] | rf [°C./W] | R [°C./W] |
|---|---|---|---|
| Conventional heat sink | 0.0098 | 0.0147 | 0.0245 |
| Heat sink in the invention | 0.0100 | 0.0101 | 0.0201 |

As is evident from Table 3, in the case of the heat sink according to the present invention, the increase in the thermal resistance at the block section (rb) due to the arrangement of the heat pipes in a parallel zigzag form and in two stages is slight (2%), while the thermal resistance at the fin section (rf) is improved significantly (31%). As a result, it is recognized that the total thermal resistance (R) is lowered from 0.0245° C./W in the case of the conventional heat sink to 0.0201° C./W—showing an improvement of as much as 18%.

In addition, through the increase in the number of stages of the heat pipes arranged in a parallel zigzag form as in Example 3, an increase in the permissible upper limit of $P_1/D_0$ was observed compared with in Examples 1 and 2.

Besides, in the case of the heat sink in this example having the heat pipes arranged in a parallel zigzag form and in two stages, it is preferable for $P_1/D_0$ to be within a range of 0.5 to 1.25 in order to obtain the most efficient total thermal resistance.

In carrying out of the present invention, with regard to the block, the quality of the material and the size may be selected according to the heat-generating capacity of the thyristors. Also, with regard to the heat pipe, it is not confined to copper-water type, but ones consisting of various kinds of materials and working fluids may be used. The size and shape of the heat pipes can also be determined freely as required.

As described above, the heat sinks of the present invention have a remarkable radiation characteristic, since the thermal resistance of the fin section is reduced by the occurrence of the turbulence in air flow around the fin section. Moreover, the total thermal resistance is improved significantly.

What is claimed is :

1. A heat pipe heat sink comprising:
(a) a block;
(b) a plurality of heat pipes in thermal contact with said block and protruding therefrom in at least two parallel planar arrays, hereinafter referred to as a first planar array and a second planar array, a first portion of each one of said plurality of heat pipes (hereinafter referred to as the heat-in portion) being inserted in said block and a second portion of each one of said plurality of heat pipes (hereinafter referred to as the heat-out portion) protruding from said block, said first planar array being generally disposed in and symmetrical about a first plane and said second planar array being generally disposed in and symmetrical about a second plane spaced from said first plane by a first pitch $P_1$, the heat-out portions of said plurality of heat pipes being of uniform cylindrical cross section and having diameters $D_0$, said first pitch $P_1$ being less than the diameter $D_0$ of said plurality of heat pipes, each heat pipe in said second planar array being located at least approximately midway between two adjacent heat pipes in said first planar array, whereby a cooling medium impinged upon said plurality of heat pipes in the direction parallel to said at least two parallel planar arrays flows over and around said plurality of heat pipes in said at least two parallel planar arrays in a zig-zag fashion; and (c) a plurality of radiating fins in thermal contact with said plurality of heat pipes.

2. A heat sink as recited in claim 1 wherein the cross-sectional area of the heat-in portions of said plurality of heat pipes exceeds the cross-sectional area of the heat-out portions of said plurality of heat pipes.

3. A heat sink as recited in claim 1 wherein the distance in said first plane between the axis of each heat pipe in said first planar array and the projection into said first plane of the axes of the adjacent heat pipes in said second planar array is a uniform second pitch $P_2$.

4. A heat sink as recited in claim 3 wherein the ratio of $P_2$ to $D_0$ is between 1.5 and 2.0.

5. A heat sink as recited in claim 1 wherein the ratio of $P_1$ to $D_0$ is between 0.5 and 0.75.

6. A heat sink as recited in claim 1 wherein:

(a) said plurality of heat pipes protrude from said block in at least three planar arrays, hereinafter referred to as a first planar array, a second planar array, and a third planar array;

(b) said first, second, and third planar arrays are generally disposed in and symmetrical about a first, second, and third plane, respectively;

(c) said first and second planes are spaced from each other by said first pitch $P_1$;

(d) said second and third planes are spaced from each other by said first pitch $P_1$;

(e) each heat pipe in said second planar array is located at least approximately midway between two adjacent heat pipes in said first planar array;

(f) each heat pipe in said second planar array is located at least approximately midway between two adjacent heat pipes in said third planar array; and (g) said heat pipes are spaced from one another so that a cooling medium impinged upon said heat pipes in the direction parallel to said at least three planar arrays flows over and around said heat pipes in said at least three parallel planar arrays in a zig-zag fashion.

* * * * *